(12) United States Patent
Shill et al.

(10) Patent No.: US 9,444,478 B2
(45) Date of Patent: Sep. 13, 2016

(54) VOLTAGE REGULATOR WITH LOAD COMPENSATION

(71) Applicant: TEXAS INSTRUMENTS INCORPORATED, Dallas, TX (US)

(72) Inventors: Mark Allan Shill, Tucson, AZ (US); Binan Wang, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/848,837

(22) Filed: Sep. 9, 2015

(65) Prior Publication Data

US 2016/0072516 A1    Mar. 10, 2016

Related U.S. Application Data

(60) Provisional application No. 62/048,482, filed on Sep. 10, 2014.

(51) Int. Cl.
| | |
|---|---|
| *H03M 1/06* | (2006.01) |
| *G05F 3/26* | (2006.01) |
| *H03M 1/00* | (2006.01) |
| *H03M 1/66* | (2006.01) |
| *H02M 3/156* | (2006.01) |
| *G05F 3/30* | (2006.01) |

(52) U.S. Cl.
CPC ............... *H03M 1/06* (2013.01); *G05F 3/262* (2013.01); *H03M 1/002* (2013.01); *H03M 1/66* (2013.01); *G05F 3/30* (2013.01); *H02M 3/156* (2013.01); *H03M 1/00* (2013.01)

(58) Field of Classification Search
CPC ......... H03M 1/00; H02M 3/156; G05F 3/30; G05F 3/262

USPC ........ 341/118; 323/282, 313, 314, 315, 316, 323/275
See application file for complete search history.

(56) References Cited

U.S. PATENT DOCUMENTS

| | | | |
|---|---|---|---|
| 6,078,168 A | 6/2000 | Paolo | |
| 2004/0027108 A1* | 2/2004 | Schreck | .................... G05F 1/46 323/282 |
| 2013/0169461 A1 | 7/2013 | Sienko | |

FOREIGN PATENT DOCUMENTS

SU    SU417780    7/1974

OTHER PUBLICATIONS

International Application Search Report in corresponding PCT Patent Application No. PCT/US2015/049484, dated Dec. 24, 2015.

\* cited by examiner

*Primary Examiner* — Joseph Lauture
(74) *Attorney, Agent, or Firm* — Tuenlap D. Chan; Frank D. Cimino

(57) ABSTRACT

A voltage regulation system provides a relatively stable voltage source without introducing the typical costs of a ground buffer. The disclosed voltage regulation system includes a voltage regulator that is operative to detect a change of the load current and regulate a current bypass mechanism to stabilize a total supply current. For example, the voltage regulator includes a current sensor and a current compensation circuit. The current sensor is configure to generate a current compensation signal based on the load current change, whereas the current compensation circuit is configured to adjust a bypass current in response to the current compensation signal. As a result, the bypass current dynamically compensates the load current change such that the ground voltage of a variable load becomes relatively stable over a range of load currents.

48 Claims, 5 Drawing Sheets

VOLTAGE REGULATOR WITH LOAD COMPENSATION

CROSS REFERENCE TO RELATED APPLICATIONS

Under 35 U.S.C. §119(e), this application claims the benefits of and priority to U.S. Provisional Application 62/048,482 (Texas Instruments docket number TI-75266PS) filed on Sep. 10, 2014, the entirety of which is incorporated herein by reference.

BACKGROUND

Voltage regulators are used for providing voltage sources for operating analog circuitries. These voltage sources may include supply voltages (e.g., VDD) and reference voltages (e.g., VREF). A load circuit that receives the voltage source may experience a change of impedance during operations, such that the corresponding load current may be operation dependent. For instance, a digital-to-analog conversion (DAC) circuit typically includes a resistor network that has a variable resistance depending on a digital code. The DAC circuit operates to convert the digital code to an analog signal by manipulating the resistor network under a reference voltage. When the variable resistance changes according to the digital code, the resistor network may drain a different amount of load current to a ground source. In the likely scenario where the ground source includes parasitic elements, the changing load current will cause the ground voltage to fluctuate. The fluctuating ground voltage directly impacts the stability of the reference voltage. As a result, the performance and reliability of the DAC circuit may become code-dependent.

To alleviate the code-dependency of the DAC circuit, attempts have been made in the past to use a ground buffer in conjunction with a voltage regulator. The ground buffer operates to stabilize the ground voltage of the resistor network by means of a feedback control mechanism. However, the ground buffer generally increases the design complexity, the power consumption, and the size of the overall circuit. The deployment of ground buffers thus becomes infeasible in systems with stringent design constraints. Accordingly, there is a need for a voltage regulator that can provide a relatively stable voltage source without incurring the design costs of a ground buffer.

SUMMARY

The present disclosure describes a voltage regulation system that provides a relatively stable voltage source without introducing the typical costs of a ground buffer. The disclosed voltage regulation system includes a voltage regulator that is operative to detect a change of the load current and regulate a current bypass mechanism in response to the detected load current change. The current bypass mechanism dynamically compensates the load current change, thereby stabilizing a total ground current. As a result, the ground voltage of a variable load becomes relatively stable over a range of load currents.

In one implementation, for example, the present disclosure describes a reference voltage regulation (RVR) circuit for supplying a reference voltage across a variable load. The RVR circuit includes a first output node, a second output node, a current compensation circuit, and a current sensor. The first output node is configured to deliver an output current to the variable load. The second output node is configured to collect the output current from the variable load. The current compensation circuit is coupled between the first and second output nodes. The current compensator circuit has a control terminal that is configured to receive a current compensation signal for adjusting a compensation current across the first and second output nodes via the current compensator circuit. The current sensor is coupled with the first and second output nodes to sense a change of the output current. As a result of the sensing, the current sensor is configured to generate the current compensation signal based on the sensed change of the output current.

In another implementation, for example, the present disclosure describes a reference voltage regulation (RVR) circuit for supplying a reference voltage across a variable load. The RVR circuit includes a first output node, a second output node, a current compensation circuit, and a current sensor with a supply current path and a monitoring current path. The first output node configured to deliver an output current to the variable load. The second output node configured to collect the output current from the variable load. The current compensation circuit is coupled between the first and second output nodes. The current compensator circuit has a control terminal that is configured to receive a current compensation signal for adjusting a compensation current across the first and second output nodes via the current compensator circuit. The supply current path has a supply output node that is coupled with the first output node to deliver a supply current sustaining the output current and the compensation current. The monitoring current path is configured to deliver a monitoring current responsive to the sensed change of the output current. Moreover, the monitoring current path has a monitoring output node to deliver the current compensation signal based on the monitoring current.

In another implementation, for example, the present disclosure describes a reference voltage regulation (RVR) circuit for supplying a reference voltage across a variable load. The RVR circuit includes a first output node, a second output node, a current compensation circuit, and a current sensor with a first sensing stage and a second sensing stage. The first output node configured to deliver an output current to the variable load. The second output node configured to collect the output current from the variable load. The current compensation circuit is coupled between the first and second output nodes. The current compensator circuit has a control terminal that is configured to receive a current compensation signal for adjusting a compensation current across the first and second output nodes via the current compensator circuit. The first sensing stage is coupled with the first output node to sense the change of the output current. The first sensing stage is configured to generate a current sense signal responding positively to the sensed change of the output current. The second sensing stage is coupled with the first sensing stage to receive the current sense signal. The second sensing stage is configured to generate the current compensation signal based on a comparison between the current sense signal and a predetermined set voltage.

In yet another implementation, for example, the present disclosure describes a digital-to-analog conversion (DAC) system that includes a variable resistance network, a current compensation circuit, and a current sensor. The variable resistance network has a high reference node and a low reference node. The variable resistance network is configured to conduct a load current from the high reference node to the low reference node such that the load current is adjustable based on a digital code. The current compensation circuit is coupled between the high and low reference nodes. The current compensator circuit has a control terminal that is configured to receive a current compensation signal for adjusting a compensation current bypassing the variable resistance network. The current sensor is coupled with the high and low reference nodes to sense a change of the load current. As a result of the sensing, the current sensor is configured to generate the current compensation signal based on the sensed change of the load current.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
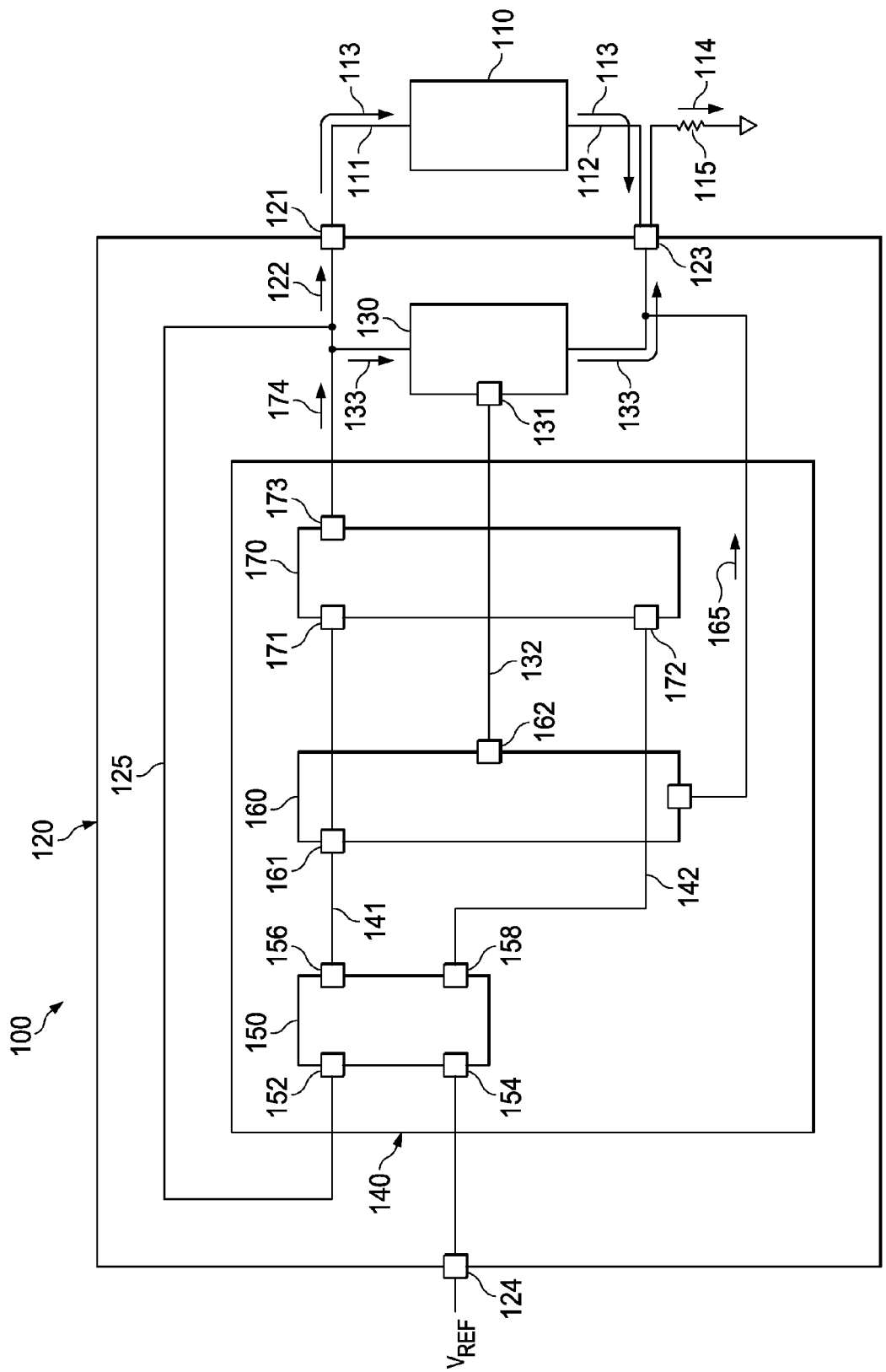
FIG. 1 shows a schematic view of an exemplary voltage regulation system according to an aspect of the present disclosure.

FIG. 1 shows a schematic view of an exemplary voltage regulation system 100 according to an aspect of the present disclosure. The voltage regulation system 100 includes a voltage regulation circuit 120 and a variable load circuit 110. In operation, the voltage regulation circuit 120 provides a relatively stable source of voltage across the variable load circuit 110. The source of voltage may include a supply voltage (e.g., VDD) and/or a reference voltage (e.g., $V_{REF}$). The voltage regulation circuit 120 includes a current bypass control mechanism to dynamically adjust a compensation current 133 that bypasses the variable load circuit 110. When the impedance of the variable load circuit 110 changes, the load current 113 fluctuates. The compensation current 133 generally compensates the fluctuations in the load current 113, thereby stabilizing a ground current 114. The stabilization of the ground current 114 also helps stabilize the voltage across the variable load circuit 110.

The voltage regulation circuit 120 includes an input node 124, a first output node 121, and a second output node 123. In the event that the voltage regulation circuit 120 regulates a supply voltage, the input node 124 is configured to receive the supply voltage for regulation. Alternatively, in the event that the voltage regulation circuit 120 regulates a reference voltage, the input node 124 is configured to receive the reference voltage ($V_{REF}$) for regulation. The voltage regulation circuit 120 monitors and adjusts its output at the first output node 121 and the second output node 123 so as to maintain thereacross a potential difference that corresponds to the voltage received at the input node 124. For instance, the input node 124 may receive a reference voltage ($V_{REF}$) relative to a ground voltage. The input reference voltage ($V_{REF}$) may be generated by a reference voltage generator (e.g., a voltage divider circuit).

The voltage regulation circuit 120 monitors the load current 113 of the variable load circuit 110 and adjusts the compensation current 133 accordingly to maintain a relatively constant potential difference across the first output node 121 and the second output node 123. As such, the first output node 121 is regulated at a high reference voltage ($V_{REFH}$) whereas the second output node 123 is regulated at a low reference voltage ($V_{REFL}$). The difference between the high reference voltage ($V_{REFH}$) and the low reference voltage ($V_{REFL}$) corresponds to the input reference voltage ($V_{REF}$).

More specifically, the first output node 121 is coupled to a high reference node 111 of the variable load circuit 110, whereas the second output node 123 is coupled to a low reference node 112 of the variable load circuit 110. In this configuration, the first output node 121 delivers an output current 122 to the variable load circuit 110, whereas the second output node 123 collects the delivered output current (i.e., the load current) 113 from the variable load circuit 110. The variable load circuit 110 may have output impedance that varies according to one or more operations of the variable load circuit 110. As the voltage regulation circuit 120 maintains a relatively stable potential across the high reference node 111 and the low reference node 112, the changing output impedance may introduce a change in output current 122 across the variable load circuit 110. In one implementation, for instance, the variable load circuit 110 may be a digital-to-analog conversion (DAC) circuit which includes a variable resistance network that is configured to conduct a load current 113 based on its load impedance. Because the load impedance changes according to a digital input code, the load current 113 is dependent on the digital input code.

To serve as a voltage regulation means, the voltage regulation circuit 120 includes a current compensation circuit 130 and a current sensor 140. The current compensation circuit 130 serves as a bypassing means for dynamically adjusting a compensation current 133 that bypasses the variable load circuit 110. The current sensor 140 serves as a feedback means for tracking the load current 113 and controlling the current compensation circuit 130 to compensate changes in the load current 113. Working in conjunction with each other, the current compensation circuit 130 and the current sensor 140 sustain a supply current 174 and a ground current 114 at a relatively constant level.

The current compensation circuit 130 is coupled between the first output node 121 and the second output node 123. The current compensation circuit 130 includes a control terminal 131 that is configured to receive a current compensation signal 132 from the current sensor 140. The current compensation signal 132 directs the current compensation circuit 130 to adjust the compensation current 133. The compensation current 133 is conducted across the first output node 121 and the second output node 123 to bypass the variable load circuit 110. By adjusting the compensation current 133, the current compensation circuit 130 helps sustain a relatively constant ground current 114 over a range of load current 113. In return, the relatively constant ground current 114 maintains a relatively constant ground voltage above the ground parasitic resistor 115. The relatively constant ground voltage stabilizes the potential difference across the high reference node 111 and the low reference node 112 of the variable load circuit 110.

The current sensor 140 is coupled with the first output node 121 and the second output node 122 to sense a change of the output current 122, which is induced by a change of the load current 113 due to a change of the load impedance of the variable load circuit 110. The current sensor 140 is configured to generate the current compensation signal 132 based on the sensed change of the output current 122. In general, the current sensor 140 is configured to adjust the current compensation signal 132 to stabilize a supply current 174, which is distributed as the compensation current 133 and the output current 122 at the first output node 121. The compensation current 133 and the output current 122 rejoin at the second output node 123 to form the ground current 114. By stabilizing the supply current 174, the current sensor 140 also stabilizes the ground current 114 and the ground voltage across the ground parasitic resistor 115. For example, upon sensing a reduction of the output current 122, the current sensor 140 is configured to adjust the current compensation signal 132 to increase the compensation current 133. Alternatively, upon sensing an increment of the output current 122, the current sensor 140 is configured to adjust the current compensation signal 132 to reduce the compensation current 133.

In one configuration, the current sensor 140 includes a VREF comparison circuit 150, a monitoring current path 160, and a supply current path 170. The VREF comparison circuit 150 serves as a tracking means for tracking a change of voltage at the first output node 121. This change of voltage indicates a transient change of output current 122 due to a change of output impedance of the variable load circuit 110. The VREF comparison circuit 150 includes a first input 152, a second input 154, a first output 156, and a second output 158. The first input 152 is coupled with the first output node 121 via a feedback path 125. To that end, the first input 152 may share a DC voltage with the first output node 121. The second input 154 is coupled to the input node 124 of the voltage regulation circuit 120 for receiving the input reference voltage ($V_{REF}$).

In general, the VREF comparison circuit 150 is configured to track the high reference voltage ($V_{REFH}$) at the first output node 121 by comparing the high reference voltage ($V_{REFH}$) to the input reference voltage ($V_{REF}$) receives by the input node 124 of the voltage regulation circuit 120. Based on this comparison, the VREF comparison circuit 150 generates a first feedback control signal 141 and a second feedback ground signal 142. The first feedback signal 141 is output by the first output 156, and it is then fed to the monitoring current path 160 and the supply current path 170. The second feedback signal 142 is optionally delivered at the second output 158, and it may be fed to the supply current path 170 in conjunction with the first feedback control signal 141. When the VREF comparison circuit 150 operates within its operation range, the first and second feedback signals 141 and 142 may have a substantially linear relationship with a difference between the input reference voltage ($V_{REF}$) and the high reference voltage ($V_{REFH}$).

The monitoring current path 160 is coupled with the VREF comparison circuit 150 to receive the first feedback control signal 141. In one implementation, for instance, the monitoring current path 160 includes a monitoring input node 161 to receive the first feedback control signal 141 from the first output 156 of the VREF comparison circuit 150. In response to the first feedback control signal 141, the monitoring current path 160 generates and delivers a monitoring current 165. Because the first feedback control signal 141 represents a sensed change of the output current 122, the monitoring current 165 is responsive to the sensed change of the output current 122 as well. The monitoring current 165 drives the current compensation signal 132 such that the current compensation signal 132 is also responsive to the sensed change of output current 122. The monitoring current path 160 includes a monitoring output node 162 for delivering the current compensation signal 132.

The supply current path 170 is coupled with the VREF comparison circuit 150 to receive the first feedback control signal 141 and optionally the second feedback control signal 142. In one implementation, for instance, the supply current path 170 includes a first supply input node 171 coupled with the first output 156 to receive the first feedback control signal 141, and a second supply input node 172 coupled with the second output 158 to receive the second feedback control signal 142. In response to the first feedback control signal 141 and optionally to the second feedback control signal 142, the supply current path 170 delivers the supply current 174 to sustain the output current 122 and the compensation current 133. Although the supply current path 170 maintains a relatively stable supply current 174 for DC operations, the supply current path 170 may also be adjusted by the first and second feedback control signals 141 and 142 to provide a transient response to a change of output current 122. The transient response in the supply current 174 serves to maintain the high reference voltage ($V_{REFH}$) at the first output node 121 while the current compensation circuit 130 is responding to the changing output current 122.

Figure 2:
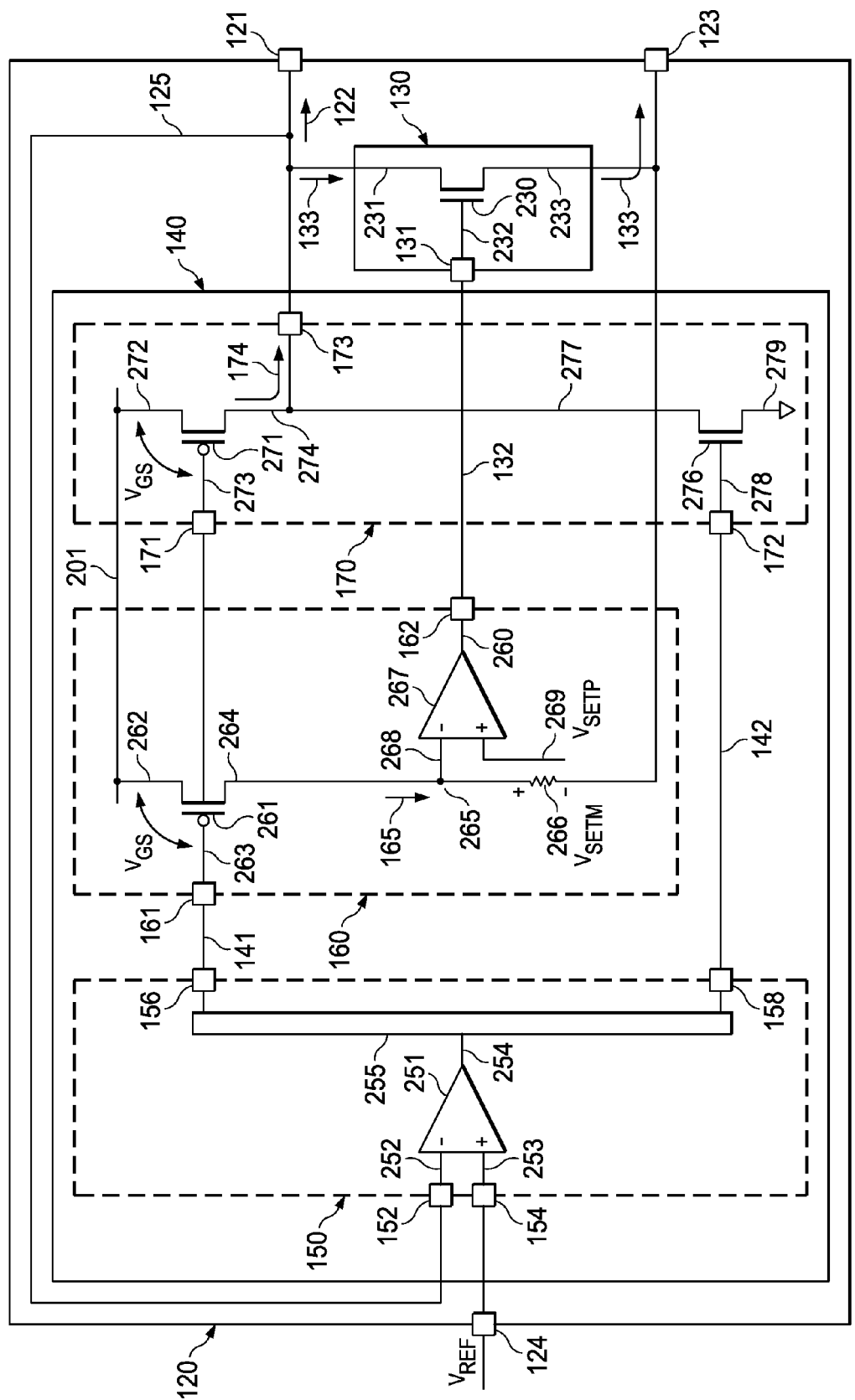
FIG. 2 shows a schematic view of an exemplary voltage regulation circuit according to an aspect of the present disclosure.

FIG. 2 shows a schematic view of an exemplary voltage regulation circuit 120 according to an aspect of the present disclosure. The voltage regulation circuit 120 as shown in FIG. 2 provides a specific implementation of the voltage regulation circuit 120 as shown in FIG. 1. While the circuitry in FIG. 2 further elaborates the structure and operations of the voltage regulation circuit 120 in FIG. 1, it does not limit or restrict the description of FIG. 1.

The VREF comparison circuit 150 includes an amplifier 251 and an output stage 255. The amplifier 251 has a negative input 152 and a positive input 154. The negative input 152 is coupled with the first output node 121 to receive the high reference voltage ($V_{REFH}$) via the feedback path 125, whereas the positive input 154 is coupled with input node 124 to receive the input reference voltage ($V_{REF}$). In an exemplary configuration, the amplifier 251 detects a difference between the input reference voltage ($V_{REF}$) and the high reference voltage ($V_{REFH}$) and amplifies the detected difference under a substantially linear function, for instance: $Vo=Ao(V_{plus}-V_{minus})$, where Vo is the amplification output at the output node 254 and Ao is the gain of the linear function. The amplifier 251 may include one or more differential amplifier in one implementation. In another implementation, the amplifier 251 may include one or more operational amplifier. In yet another implementation, the amplifier 251 can include other types of amplification circuits that are suitable for performing the functions as described above.

Depending on the configuration of the monitoring current path 160 and the supply current path 170, the VREF comparison circuit 150 may include an output stage 255. In the event that the amplifier 251 is an operational amplifier, the output stage 255 may be an operational output stage with a class AB bias. The output stage 255 is configured to process the amplification output received from the output node 254 and generate the first and second feedback control signals 141 and 142. In generate, first and second feedback control signals 141 and 142 are adjusted proportionally to the change of the output current 122 and for the function of maintaining a relatively stable high reference voltage ($V_{REFH}$) at the first output node 121.

The supply current path 170 includes a p-channel transistor 271 and an re-channel transistor 276. The p-channel transistor 271 includes a source node 272, a gate node 273, and a drain node 274. The source node 272 is coupled to an internal voltage supply source 201, such as VDD or VCC. The gate node 273 is coupled to the first supply input node 171 to receive the first feedback control signal 141. Based on a difference between the internal voltage supply source 201 and the voltage of the first feedback control signal 141, the p-channel transistor 271 establishes a gate-to-source voltage $V_{GS}$, which in turns controls the amount of supply current 174 the p-channel transistor 271 conducts. Because the first feedback control signal 141 is responsive to the change of output current 122, the adjustment of the supply current 174 is also responsive to the change of the output current 122. The p-channel transistor 271 conducts the supply current 174 from its source node 272 to its drain node 274, which is coupled to the supply output node 173 for delivering the supply current 174. Thus, the p-channel transistor 271 is a part of a supply current feedback loop, within which the supply current 174 is monitored and regulated by the VREF comparison circuit 150 and the supply current path 170. The p-channel transistor 271 may include one or more PMOS transistors in one implementation. Alternatively, the p-channel transistor 271 may include other types of transistors that are suitable for performing the functions as described above.

The n-channel transistor 276 serves as a bias component to maintain a certain voltage across the p-channel transistor 271 such that the p-channel transistor 271 may have a proper amount of drain-to-source voltage $V_{DS\_1}$ to drive the supply current 174. By conducting a source current (or quiescent current), the n-channel transistor 276 establishes its own drain-to-source voltage $V_{DS\_2}$ across its drain node 277 and its source node 279. This drain-to-source voltage $V_{DS\_2}$ contributes to the stability of the high reference voltage ($V_{REFH}$) as the drain node 277 is coupled to the first output node 121. The n-channel transistor 276 includes a gate node 278, which is coupled to the second supply input node 172 to receive the second feedback control signal 142. Using the second feedback control signal 142, the VREF comparison circuit 150 controls the amount of source current conducted by the n-channel transistor 276. By adjusting the gate voltage at the gate node 278, the VREF comparison circuit 150 also regulates the drain voltage at the drain node 277, which in turns helps maintain a relatively constant high reference voltage ($V_{REFH}$). Thus, the n-channel transistor 276 is a part of a high reference voltage ($V_{REFH}$) feedback loop, within which the high reference voltage ($V_{REFH}$) is monitored and regulated by the VREF comparison circuit 150 and the supply current path 170. The n-channel transistor 276 may include one or more NMOS transistors in one implementation. Alternatively, the n-channel transistor 276 may include other types of transistors that are suitable for performing the functions as described above.

The monitoring current path 160 includes a p-channel transistor 261, a set resistor 266, and a set voltage (VSET) comparison circuit 267. The p-channel transistor 261 includes a source node 262, a gate node 263, and a drain node 264. The source node 262 is coupled to the internal voltage supply source 201. The gate node 263 is coupled to the first supply input node 161 to receive the first feedback control signal 141. Based on a difference between the internal voltage supply source 201 and the voltage of the first feedback control signal 141, the p-channel transistor 261 establishes a gate-to-source voltage ($V_{GS}$), which in turns controls the amount of monitoring current 165 the p-channel transistor 261 conducts.

Because the first feedback control signal 141 is responsive to the change of output current 122, the adjustment of the monitoring current 165 is also responsive to the change of the output current 122. Moreover, the p-channel transistor 261 and the p-channel transistor 271 are arranged in a mirror configuration such that both transistors are biased with substantially the same amount of gate-to-source voltage ($V_{GS}$). In a configuration that the p-channel transistor 261 and the p-channel transistor 271 have similar electron mobility, the monitoring current 165 is proportional to, and thus keeps track of, the supply current 174. Thus, the monitoring current 165 is sensitive and responsive to the change of the supply current 174, which in part can be attributed by a change of the output current 122. The p-channel transistor 261 may include one or more PMOS transistors in one implementation. Alternatively, the p-channel transistor 261 may include other types of transistors that are suitable for performing the functions as described above The monitoring current 165 is generally less than the supply current 174 because the monitoring current 165 is not used for supplying the load current 113. Thus, the size of the p-channel transistor 261 is typically smaller than that of the p-channel transistor 271. The p-channel transistor 261 conducts the monitoring current 165 from its source node 262 to its drain node 264, which is coupled to a set node 265. The set resistor 266 is coupled to the set node 265 to receive the monitoring current 165. By conducting the monitoring current 165, the set resistor 266 establishes a monitoring set voltage ($V_{SETM}$) at the set node 165. Because the monitoring set voltage ($V_{SETM}$) is a function of the monitoring current 165, the monitoring set voltage ($V_{SETM}$) is sensitive and responsive to the supply current 174, which in part can be attributed by a change of the output current 122.

The VSET comparison circuit 267 is configured to compare the monitoring set voltage ($V_{SETM}$) with a predetermined set voltage ($V_{SETP}$ so as to generate the current compensation signal 132. The VSET comparison circuit 267 serves as a tracking means for tracking a change in the monitoring current 165, which is indicative of a change in the supply current 174 as well as the output current 122. The VSET comparison circuit 267 includes a first input 268 (which can be a negative input), a second input 269 (which can be a positive input), and a comparison output 260. The first input 268 is coupled to the set node 265 to receive the monitoring set voltage ($V_{SETM}$), whereas the second input 269 is coupled to a voltage source to receive the predetermined set voltage ($V_{SETP}$). The VSET comparison circuit 267 delivers the current compensation signal 132 to the monitoring output node 162 via the comparison output 260. When the VSET comparison circuit 267 operates within its operation range, the current compensation signal 132 may have a substantially linear relationship with a difference between the predetermined set voltage ($V_{SETP}$) and the monitoring set voltage ($V_{SETM}$).

Like the VREF comparison circuit 150, the VSET comparison circuit 267 may include an amplification circuit to perform the functions as described above. In one implementation, for example, the comparison circuit 267 may include a differential amplifier. In another implementation, for example, the comparison circuit 267 may include an operational amplifier with an output stage having a class AB bias. Regardless of the type of amplification circuit deployed by the VSET comparison circuit 267, the VSET comparison circuit 267 is configured to detect a difference between the predetermined set voltage ($V_{SETP}$) and the monitoring set voltage ($V_{SETM}$) and amplify the detected difference under a substantially linear function. The detected difference can be used as an indicator of the magnitude of the detected load current 113 being below the maximum value (or peak value) of the load current 113.

Accordingly, the predetermined set voltage ($V_{SETP}$) can be configured based on a function of the set resistor 266 and an estimated maximum value of the output current 122, which corresponds to the maximum value of the load current 113. The purpose of the predetermined set voltage ($V_{SETP}$) is to provide a comparison threshold for the monitoring current path 160, such that the monitoring current path 160 can adjust the current compensation signal 132 in response to the change of output current 122. In one implementation, for example, the predetermined set voltage ($V_{SETP}$) can be configured according to Equation 1 below.

$$V_{SETP} = I_{MON} * R_{SET} \qquad \text{Eq. (1)}$$

The monitoring current ($I_{MON}$) 165 is a function of the supply current ($I_{SUPP}$) 174. The maximum value of the supply current $I_{SUPP(Max)}$ 174 corresponds to the maximum value (or peak value) of the load current 113 when the variable load circuit 110 has the minimum amount of impedance. The magnitudes of these two currents 165 and 174 are correlated by their respective transistor sizes. In a configuration where the p-channel transistor 261 has a channel width of $W_{P1}$ and the p-channel transistor 271 has a channel width of $W_{P2}$, the predetermined set voltage ($V_{SETP}$) can be expressed by Equation 2 below.

$$V_{SETP} = \frac{W_{P1}}{W_{P2}} (I_{SUPP(Max)}) * R_{SET} \qquad \text{Eq. (2)}$$

Meanwhile, the supply current 174 delivered to the first output node 121 and the quiescent current ($I_N$) delivered to the n-channel transistor 276 come from the current ($I_{P2}$) conducted by the p-channel transistor 271. Thus, the predetermined set voltage ($V_{SETP}$) can also be expressed by Equation 3 below.

$$V_{SETP} = \frac{W_{P1}}{W_{P2}} (I_{P2(Max)} - I_N) * R_{SET} \qquad \text{Eq. (3)}$$

The maximum current ($I_{P2(Max)}$) conducted by the p-channel transistor 271 is driven by, and thus responsive to, the maximum value (or peak value) of the load current 113. Thus, the p-channel transistor 261, the set resistor 266, and the comparison circuit 267 are a part of a current monitoring feedback loop that tracks current consumption of the variable load circuit 110. This current monitoring feedback loop also helps adjust the amount of compensation current 133 that bypasses the variable load circuit 110 in order to maintain a relatively stable ground current 114, which in turn helps sustain a relatively stable low reference voltage ($V_{REFL}$) at the second output node 123.

The current compensation circuit 130 is configurable by the current compensation signal 132 for adjusting the compensation current 133. Thus, the current compensation circuit 130 may include one or more current switch that is responsive to the adjustment indicated by the current compensation signal 132. In one implementation, for example, the current compensation circuit 130 may include an n-channel transistor 230. The n-channel transistor 230 includes a drain node 231 that is coupled to the first output node 121, a gate node 232 that is coupled to the monitoring output node 162 via the control terminal 131, and a source node 233 that is coupled to the second output node 123.

The gate node 232 receives the current compensation signal 132 to establish a gate-to-source voltage ($V_{GS}$) across the gate node 232 and the source node 233. The magnitude of the $V_{GS}$ controls the amount of compensation current 133 conducted from the drain node 231 to the source node 233. In a configuration where the n-channel transistor 230 is deployed as the current switch, the adjustment of the compensation current 133 is directly proportional to a positive $V_{GS}$. In an alternative configuration where a p-channel transistor is deployed as the current switch (e.g., the monitoring current path 160 includes a set current source above an n-channel transistor and the inputs of the VSET comparison circuit 267 switch polarity), the adjustment of the compensation current 133 is directly proportional to a negative $V_{GS}$.

To further illustrate the operation of the voltage regulation circuit 120 as shown in FIG. 2, the present disclosure provides two exemplary scenarios. In a first scenario, the impedance of the variable load circuit 110 reduces, thereby causing the load current 113 to increase. The increased load current 113 in turn causes the low reference voltage ($V_{REFL}$) to increase at the second output node 123, while the reduced load impedance causes the high reference voltage ($V_{REFH}$) to drop at the first output node 121. The VREF comparison circuit 150 (e.g., the amplifier 251 and the output stage 255) senses the high reference voltage ($V_{REFH}$) drop by comparing the voltage of the feedback path 125 to the input reference voltage ($V_{REF}$).

In response, the VREF comparison circuit 150 adjust the first and second feedback control signal 141 and 142 to increase the supply current 174 conducted by the supply current path 170. More specifically, the first feedback control signal 141 is reduced to increase the $V_{GS}$ of the p-channel transistor 271, and the second feedback control signal 142 is reduced to reduce the VGS of the n-channel transistor 276. As a result, more supply current 174 is delivered as the n-channel transistor 276 takes up less current. Instantaneously before the current compensation signal 132 becomes responsive to the change of load current 113, the increased supply current 174 allows more output current 122 to be distributed to the variable load circuit 110 while the compensation current 133 remains unchanged at that point of time. This increased load current 113 increases the high reference voltage ($V_{REFH}$) above the reduced impedance of the variable load circuit 110, thereby stabilizing the voltage level at the first output node 121.

The reduction of the first feedback control signal 141 also increases the $V_{GS}$ of the p-channel transistor 261 of the monitoring current path 160. As a result, the p-channel transistor 261 increases the amount of monitoring current 165 going through the set resistor 266, thereby causing the monitoring set voltage ($V_{SETM}$) to rise. The VSET comparison circuit 267 senses the monitoring set voltage ($V_{SETM}$) increase by comparing it against the predetermined set voltage ($V_{SETP}$). In response, the VSET comparison circuit 267 adjust the current compensation signal 132 to reduce the amount of compensation current 133 conducted by the current compensation circuit 130 so as to compensate the increased load current 133.

In a configuration where the n-channel transistor 230 is deployed as a current switch, the VSET comparison circuit 267 reduces the voltage of the current compensation signal 132, which in turn causes the $V_{GS}$ voltage of the n-channel transistor 230 to shrink. Accordingly, the n-channel transistor 230 reduces the compensation current 133 to compensate the increase of load current 113. In an alternative configuration where a p-channel transistor is deployed as a current switch, the VSET comparison circuit 267 increases the voltage of the current compensation signal 132 to reduce the $V_{GS}$ voltage of the p-channel transistor. Likewise, the p-channel transistor reduces the compensation current 133 to compensate the increase of load current 113.

In a second scenario, the impedance of the variable load circuit 110 increases, thereby causing the load current 113 to decrease. The decrease load current 113 in turn causes the low reference voltage ($V_{REFL}$) to decrease at the second output node 123, while the increased load impedance causes the high reference voltage ($V_{REFH}$) to rise at the first output node 121. The VREF comparison circuit 150 (e.g., the amplifier 251 and the output stage 255) senses the high reference voltage ($V_{REFH}$) rise by comparing the voltage of the feedback path 125 to the input reference voltage ($V_{REF}$).

In response, the VREF comparison circuit 150 adjust the first and second feedback control signal 141 and 142 to reduce the supply current 174 conducted by the supply current path 170. More specifically, the first feedback control signal 141 is increased to reduce the $V_{GS}$ of the p-channel transistor 271, and the second feedback control signal 142 is increased to increase the $V_{GS}$ of the n-channel transistor 276. As a result, less supply current 174 is delivered as the n-channel transistor 276 takes up more current. Instantaneously before the current compensation signal 132 becomes responsive to the change of load current 113, the reduced supply current 174 allows less output current 122 to be distributed to the variable load circuit 110 while the compensation current 133 remains unchanged at that point of time. This reduced load current 113 reduces the high reference voltage ($V_{REFH}$) above the increased impedance of the variable load circuit 110, thereby stabilizing the voltage level at the first output node 121.

The increment of the first feedback control signal 141 also reduces the VGS of the p-channel transistor 261 of the monitoring current path 160. As a result, the p-channel transistor 261 reduces the amount of monitoring current 165 going through the set resistor 266, thereby causing the monitoring set voltage ($V_{SETM}$) to drop. The VSET comparison circuit 267 senses the monitoring set voltage ($V_{SETM}$) drop by comparing it against the predetermined set voltage ($V_{SETP}$). In response, the VSET comparison circuit 267 adjust the current compensation signal 132 to increase the amount of compensation current 133 conducted by the current compensation circuit 130 so as to compensate the reduced load current 133.

In a configuration where the n-channel transistor 230 is deployed as a current switch, the VSET comparison circuit 267 increases the voltage of the current compensation signal 132, which in turn causes the VGS voltage of the n-channel transistor 230 to widen. Accordingly, the n-channel transistor 230 increases the compensation current 133 to compensate the reduction of load current 113. In an alternative configuration where a p-channel transistor is deployed as a current switch, the VSET comparison circuit 267 reduces the voltage of the current compensation signal 132 to increase the VGS voltage of the p-channel transistor. Likewise, the p-channel transistor increases the compensation current 133 to compensate the reduction of load current 113.

The net effect of the compensation current 133 adjustment is to restore the ground current 114 to its stable level such that the low reference voltage ($V_{REFL}$) can remain low and stable. This feedback compensation scheme allows the total ground current 114 to return to a stabilized level in a relatively short period of time. Advantageously, the voltage regulation circuit 120 as described in FIG. 2 provides a robust voltage regulation performance without introducing the typical costs of an additional ground buffer.

Figure 3:
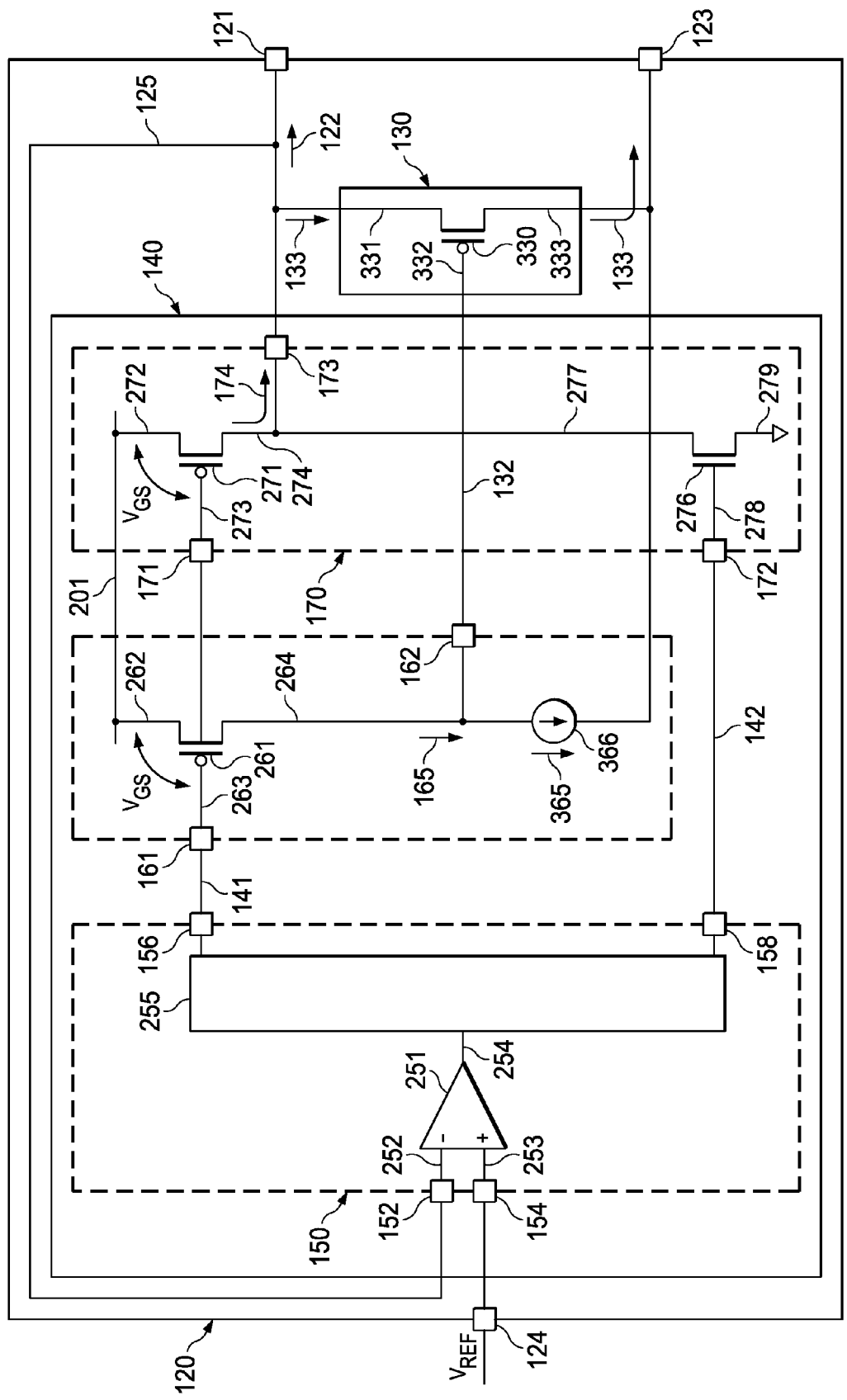
FIG. 3 shows a schematic view of an exemplary voltage regulation circuit according to another aspect of the present disclosure.

FIG. 3 shows a schematic view of an exemplary voltage regulation circuit 120 according to another aspect of the present disclosure. The voltage regulation circuit 120 as shown in FIG. 3 provides a specific implementation of the voltage regulation circuit 120 as shown in FIG. 1. While the circuitry in FIG. 3 further elaborates the structure and operations of the voltage regulation circuit 120 in FIG. 1, it does not limit or restrict the description of FIG. 1. For instance, the circuitry in FIG. 3 provides an alternative to the circuitry in FIG. 2 while these two options do not necessarily exclude each other.

In several aspects, the voltage regulation circuit 120 of FIG. 3 is similar to the voltage regulator 120 of FIG. 2. For example, FIG. 3 shows the same VREF comparison circuit 150 and the same supply current path 170 as FIG. 2. The voltage regulation circuit 120 of FIG. 3, however, deviates from that of FIG. 2 in two other aspects. First, the monitoring current path 160 is modified to replace the VSET comparison circuit 267 and the set resistor 266 with a set current source 366. The set current source 366 is coupled with the drain node 264 of the p-channel transistor 261 via the monitoring output node 162. The set current source 366 can be configured as a part of a current mirror arrangement for conducting a set current ($I_{SET}$) 365. In this particular configuration, the monitoring current path 160 is biased to conduct a constant current, which is the set current ($I_{SET}$) 365 regardless of the VGS voltage across the p-channel transistor 261. To maintain a constant current by the p-channel transistor 261, voltage of the drain node 264 moves in opposite direct as the voltage of the gate node 263, which is driven by the first feedback control signal 141.

Thus, when the VREF comparison circuit 150 reduces the voltage of the first feedback control signal 141 in response to a voltage drop in the first output node 121, the voltage of the drain node 264 is pulled up such that the p-channel transistor 261 can maintain the monitoring current 165 at a value set by the set current ($I_{SET}$) 365. The increased voltage at the drain node 264 then drives the current compensation signal 132 that is delivered by the monitoring output node 162. Similarly, when the VREF comparison circuit 150 increases the voltage of the first feedback control signal 141 in response to a voltage rise in the first output node 121, the voltage of the drain node 264 is pulled down such that the p-channel transistor 261 can maintain the monitoring current 165 at a value set by the set current ($I_{SET}$) 365. The decreased voltage at the drain node 264 then drives the current compensation signal 132 that is delivered by the monitoring output node 162.

Like the predetermined set voltage ($V_{SETP}$), the set current ($I_{SET}$) is predetermined based on a function of an estimated maximum value of the output current 122. The maximum value of the supply current $I_{SUPP(Max)}$ 174 corresponds to the peak of the load current 113 when the variable load circuit 110 is configured to incur the minimum amount of impedance. The magnitudes of these two currents 165 and 174 are correlated by their respective transistor size. In a configuration where the p-channel transistor 261 has a channel width of $W_{P1}$ and the p-channel transistor 271 has a channel width of $W_{P2}$, the predetermined set current ($I_{SET}$) can be expressed by Equation 4 below.

$$I_{SET} = \frac{W_{P1}}{W_{P2}}(I_{SUPP(Max)}) \qquad \text{Eq. (4)}$$

Because the supply current 174 and the quiescent current ($I_N$) conducted by the n-channel transistor 276 come from the current ($I_{P2}$) conducted by the p-channel transistor 271, the predetermined set current ($I_{SET}$) can also be expressed by Equation 5 below.

$$I_{SET} = \frac{W_{P1}}{W_{P2}}(I_{P2(Max)} - I_N) \qquad \text{Eq. (5)}$$

The maximum current ($I_{P2(Max)}$) conducted by the p-channel transistor 271 is driven by, and thus responsive to, the peak of the load current 113. Thus, the p-channel transistor 261 and the set current source 366 are a part of a current monitoring feedback loop that tracks current consumption of the variable load circuit 110. This current monitoring feedback loop also helps adjust the amount of compensation current 133 that bypasses the variable load circuit 110 in order to maintain a relatively stable ground current 114, which in turn helps sustain a relatively stable low reference voltage (VREFL) at the second output node 123.

The second modification of FIG. 3 involves the current compensation circuit 130. Similar to FIG. 2, the current compensation circuit 130 in FIG. 3 is configurable by the current compensation signal 132 for conducting the compensation current 133. Thus, the current compensation circuit 130 may include one or more current switch that is responsive to the adjustment indicated by the current compensation signal 132. But because the polarity of the current compensation signal 132 has flipped when compared to the current compensation signal 132 as described in FIG. 2, the current compensation circuit 130 may deploy one or more p-channel transistor 330 to implement the feedback compensation scheme as described in FIG. 2. The p-channel transistor 330 includes a source node 331 that is coupled to the first output node 121, a gate node 332 that is coupled to the monitoring output node 162 via the control terminal 131, and a drain node 333 that is coupled to the second output node 123.

The gate node 332 receives the current compensation signal 132 to establish a gate-to-source voltage ($V_{GS}$) across the gate node 332 and the source node 331. The magnitude of the $V_{GS}$ controls the amount of compensation current 133 conducted from the source node 331 to the drain node 333. In a configuration where the p-channel transistor 330 is deployed as the current switch, the adjustment of the compensation current 133 is directly proportional to a negative VGS. In an alternative configuration where an n-channel transistor is deployed as the current switch (e.g., the monitoring current path 160 includes a set current source above an n-channel transistor), the adjustment of the compensation current 133 is directly proportional to a positive VGS.

To further illustrate the operation of the voltage regulation circuit 120 as shown in FIG. 3, the present disclosure provides two exemplary scenarios. In a first scenario, the impedance of the variable load circuit 110 reduces, thereby causing the load current 113 to increase. The increased load current 113 in turn causes the low reference voltage ($V_{REFL}$) to increase at the second output node 123, while the reduced load impedance causes the high reference voltage ($V_{REFH}$) to drop at the first output node 121. The VREF comparison circuit 150 (e.g., the amplifier 251 and the output stage 255) senses the high reference voltage ($V_{REFH}$) drop by comparing the voltage of the feedback path 125 to the input reference voltage ($V_{REF}$).

In response, the VREF comparison circuit 150 adjust the first and second feedback control signal 141 and 142 to increase the supply current 174 conducted by the supply current path 170. More specifically, the first feedback control signal 141 is reduced to increase the VGS of the p-channel transistor 271, and the second feedback control signal 142 is reduced to reduce the VGS of the n-channel transistor 276. As a result, more supply current 174 is delivered as the n-channel transistor 276 takes up less current. Instantaneously before the current compensation signal 132 becomes responsive to the change of load current 113, the increased supply current 174 allows more output current 122 to be distributed to the variable load circuit 110 while the compensation current 133 remains unchanged at that point of time. This increased load current 113 increases the high reference voltage ($V_{REFH}$) above the reduced impedance of the variable load circuit 110, thereby stabilizing the voltage level at the first output node 121.

The reduction of the first feedback control signal 141 also increases the VGS of the p-channel transistor 261 of the monitoring current path 160. As a result, the p-channel transistor 261 increases the voltage of the drain node 264, thereby causing the voltage of the current compensation signal 132 to rise. In response, the current compensation circuit 130 reduces the amount of compensation current 133 conducted by the current compensation circuit 130 to compensate the increased load current 133.

For example, in a configuration where the p-channel transistor 330 is deployed as a current switch, the increased voltage of the current compensation signal 132 causes the VGS voltage of the p-channel transistor 330 to shrink. Accordingly, the p-channel transistor 330 reduces the compensation current 133 to compensate the increase of load current 113. In an alternative configuration where an n-channel transistor is deployed as a current switch, the voltage of the current compensation signal 132 is decreased to shrink the VGS voltage of the n-channel transistor. Likewise, the n-channel transistor reduces the compensation current 133 to compensate the increase of load current 113.

In a second scenario, the impedance of the variable load circuit 110 increases, thereby causing the load current 113 to decrease. The decrease load current 113 in turn causes the low reference voltage ($V_{REFL}$) to decrease at the second output node 123, while the increased load impedance causes the high reference voltage ($V_{REFH}$) to rise at the first output node 121. The VREF comparison circuit 150 (e.g., the amplifier 251 and the output stage 255) senses the high reference voltage ($V_{REFH}$) rise by comparing the voltage of the feedback path 125 to the input reference voltage ($V_{REF}$).

In response, the VREF comparison circuit 150 adjust the first and second feedback control signal 141 and 142 to reduce the supply current 174 conducted by the supply current path 170. More specifically, the first feedback control signal 141 is increased to reduce the $V_{GS}$ of the p-channel transistor 271, and the second feedback control signal 142 is increased to increase the $V_{GS}$ of the n-channel transistor 276. As a result, less supply current 174 is delivered as the n-channel transistor 276 takes up more current. Instantaneously before the current compensation signal 132 becomes responsive to the change of load current 113, the reduced supply current 174 allows less output current 122 to be distributed to the variable load circuit 110 while the compensation current 133 remains unchanged at that point of time. This reduced load current 113 reduces the high reference voltage ($V_{REFH}$) above the increased impedance of the variable load circuit 110, thereby stabilizing the voltage level at the first output node 121.

The increment of the first feedback control signal 141 also reduces the VGS of the p-channel transistor 261 of the monitoring current path 160. As a result, the p-channel transistor 261 reduces the voltage of the drain node 264, thereby causing the voltage of the current compensation signal 132 to drop. In response, the current compensation circuit 130 increases the amount of compensation current 133 conducted by the current compensation circuit 130 to compensate the decreased load current 133.

For example, in a configuration where the p-channel transistor 330 is deployed as a current switch, the decreased voltage of the current compensation signal 132 causes the $V_{GS}$ voltage of the p-channel transistor 330 to widen. Accordingly, the p-channel transistor 330 increases the compensation current 133 to compensate the reduction of load current 113. In an alternative configuration where an n-channel transistor is deployed as a current switch, the voltage of the current compensation signal 132 is increase to widen the $V_{GS}$ voltage of the n-channel transistor. Likewise, the n-channel transistor increases the compensation current 133 to compensate the reduction of load current 113.

Like the operation as described in FIG. 2, the net effect of the compensation current 133 adjustment is to restore the ground current 114 to its stable level such that the low reference voltage ($V_{REFL}$) can remain low and stable. This feedback compensation scheme allows the total ground current 114 to return to a stabilized level in a relatively short period of time. Advantageously, the voltage regulation circuit 120 as described in FIG. 3 provides a robust voltage regulation performance without introducing the typical costs of an additional ground buffer. Moreover, for not including the VSET comparison circuit 267, the voltage regulation circuit 120 of FIG. 3 consumes less power and takes up less space than the voltage regulation circuit 120 of FIG. 2.

Figure 4:
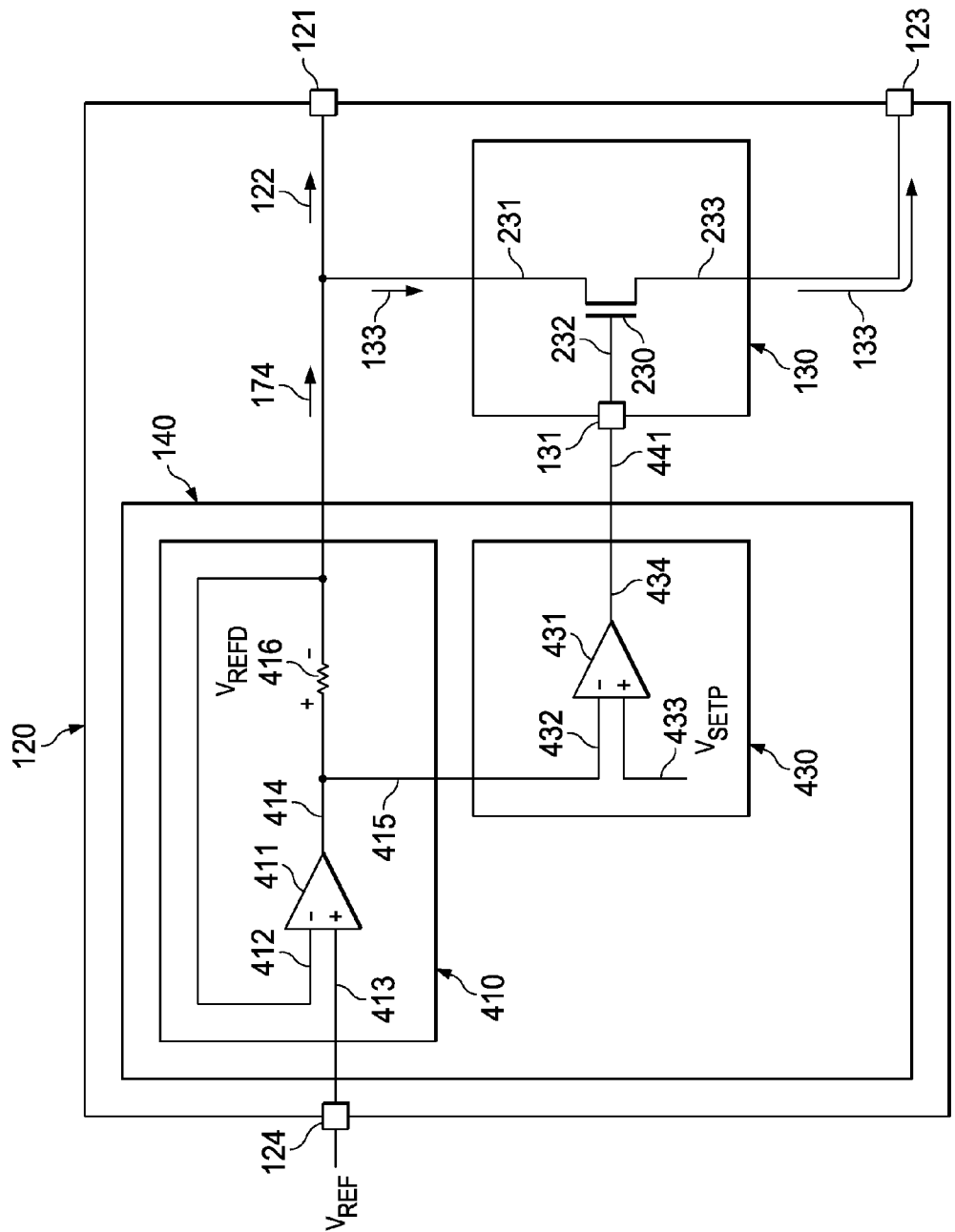
FIG. 4 shows a schematic view of an exemplary voltage regulation system with two sensing stages according to an aspect of the present disclosure.

FIG. 4 shows a schematic view of an exemplary voltage regulation circuit 120 according to yet another aspect of the present disclosure. The voltage regulation circuit 120 as shown in FIG. 4 provides a specific implementation of the voltage regulation circuit 120 as shown in FIG. 1. While the circuitry in FIG. 4 further elaborates the structure and operations of the voltage regulation circuit 120 in FIG. 1, it does not limit or restrict the description of FIG. 1. For instance, the circuitry in FIG. 4 provides an alternative to the circuitries in FIG. 2 and FIG. 3 while these options do not necessarily exclude one another.

In several aspects, the voltage regulation circuit 120 of FIG. 4 is similar to the voltage regulator 120 of FIG. 1. For example, FIG. 4 shows a current sensor 140 operating in conjunction with a current compensation circuit 130 according to the general description of FIG. 1. More specifically, the voltage regulation circuit 120 of FIG. 4 provides the same feedback compensation mechanism to sustain a relatively stable ground current 114 across the ground parasitic resistor 115. The voltage regulation circuit 120 of FIG. 4, however, deviates from the implementations of FIGS. 2 and 3 in two aspects. First the voltage regulation circuit 120 of FIG. 4 deploys a two-stage sensing approach instead of a duo-current-path approach. Second, the voltage regulation circuit 120 of FIG. 4 incorporates the VREF comparison circuit 150 into one of the sensing stage to simplify the current sensing and adjustment circuitry.

In this particular configuration, the current sensor 140 includes a first sensing stage 410 and a second sensing stage 430. The first sensing stage 410 is coupled with the first output node 121 for sensing a change of the output current 122. Based on this feedback sensing mechanism, the first sensing stage 410 generates a current sense signal that responds positively to the sensed change of the output current 122. The first sensing stage 410 includes a VREF comparison circuit 411 and a reference resistor 416. The VREF comparison circuit 411 includes a negative input lead 412 that is coupled to the first output node 121 and a positive input lead 413 that is coupled to the input node 124.

Similar to the VREF comparison circuit 150, the VREF comparison circuit 411 serves as a tracking means for tracking a change of voltage at the first output node 121. In general, the VREF comparison circuit 411 is configured to track the high reference voltage ($V_{REFH}$) at the first output node 121 by comparing the high reference voltage ($V_{REFH}$) to the input reference voltage ($V_{REF}$) received by the input node 124 of the voltage regulation circuit 120. Based on this comparison, the VREF comparison circuit 411 generates current sense signal at its output lead 414. The current sense signal has a voltage level that is high then the high reference voltage ($V_{REFH}$) at the first output node 121. This is because the current sense signal serves to provide the supply current 174 that flows through the reference resistor 416. The supply current 174 establishes a potential drop (i.e., $V_{REFD}$) across an output lead 414 of the VREF comparison circuit 411 and the first output node 121 as the reference resistor 416 is coupled between these two nodes. When the VREF comparison circuit 411 operates within its operation range, the current sense signal may have a substantially linear relationship with a difference between the input reference voltage ($V_{REF}$), which is received from the input node 124, and the high reference voltage ($V_{REFL}$), which is received from the first output node 121.

Like the VREF comparison circuit 150, the VREF comparison circuit 411 may include an amplifier that detects a difference between the input reference voltage ($V_{REF}$) and the high reference voltage ($V_{REFH}$) and amplifies the detected difference under a substantially linear function, for instance: $V_{CS}=Ao*(V_{plus}-V_{minus})$, where $V_{CS}$ is the voltage level of the current sense signal at the output lead 414 and Ao is the gain of the linear function. The amplifier of the VREF comparison circuit 411 may include one or more differential amplifier in one implementation. In another implementation, the amplifier of the VREF comparison circuit 411 may include one or more operational amplifier. In yet another implementation, the amplifier of the VREF comparison circuit 411 can include other types of amplification circuits that are suitable for performing the functions as described above. To keep the voltage at the first output node 121 at the higher reference voltage ($V_{REFH}$), the voltage level $V_{CS}$ of the current sense signal is regulated by a function of the supply current ($I_{SUPP}$) 174 and the reference resistor ($R_{REF}$) 416. For example, the voltage level $V_{CS}$ of the current sense signal can be expressed by Equation 6 below.

$$V_{CS}=I_{SUPP}*R_{REF}+V_{REF} \qquad \text{Eq. (6)}$$

The second sensing stage 430 is coupled to the first sensing stage 410 to receive the current sense signal. The second sensing stage 430 serves a monitoring function that is similar to that of the monitoring current path 160. For instance, the second sensing stage 430 includes a VSET comparison circuit 431 that is similar to the VSET comparison circuit 267. The VSET comparison circuit 431 is configured to generate a current compensation signal 441 that is based on a comparison between the current sense signal and a predetermined set voltage ($V_{SETP}$).

The VSET comparison circuit 431 serves as a tracking means for tracking a change in the supply current 174, which is proportional to a change in the output current 122. The VSET comparison circuit 431 includes a first input 432 (which can be a negative input), a second input 435 (which can be a positive input), and a comparison output 434. The first input 432 is coupled to the output lead 414 to receive the current sense voltage ($V_{CS}$) of the current sense signal, whereas the second input 435 is coupled to a voltage source to receive the predetermined set voltage ($V_{SETP}$). The VSET comparison circuit 431 delivers the current compensation signal 441 to the current compensation circuit 130 via its output lead 434. When the VSET comparison circuit 431 operates within its operation range, the current compensation signal 441 may have a substantially linear relationship with a difference between the predetermined set voltage ($V_{SETP}$) and the current sense voltage ($V_{CS}$).

The VSET comparison circuit 431 may include an amplification circuit to perform the functions as described above. In one implementation, for example, the comparison circuit 431 may include a differential amplifier. In another implementation, for example, the comparison circuit 431 may include an operational amplifier with an output stage having a class AB bias. Regardless of the type of amplification circuit deployed by the VSET comparison circuit 431, the VSET comparison circuit 431 is configured to detect a difference between the predetermined set voltage ($V_{SETP}$) and the current sense voltage ($V_{CS}$) and amplify the detected difference under a substantially linear function.

The predetermined set voltage ($V_{SETP}$) is configured based on a function of the maximum current sense voltage ($V_{CSMax}$). The purpose of the predetermined set voltage (VSETP) is to provide a comparison threshold for the supply current 174, such that the second sensing stage 430 can adjust the current compensation signal 441 in response to the change of output current 122. In one implementation, the predetermined set voltage ($V_{SETP}$) can be configured according to Equation 7 below.

$$V_{SETP} = I_{SUPPMax} * R_{REF} + V_{REF} \qquad \text{Eq. (7)}$$

The supply current ($I_{SUPP}$) 174 can be reserved to accommodate the maximum (or peak) draw of the output current 122 which is triggered by a surge of the load current 113 when the impedance of the variable load circuit 110 reaches its minimum value. Thus, this maximum supply current ($I_{SUPPMax}$) forms the baseline for comparing the fluctuating supply current ($I_{SUPP}$) 174. Because of the headroom established by the $I_{SUPPMax} * R_{REF}$ term, the predetermined set voltage ($V_{SET}$) is configured to be greater than the input reference voltage ($V_{REF}$). And to reduce the impact of this headroom, the reference resistor 416 may have a resistance that limits the headroom to about 100 mV.

To further illustrate the operation of the voltage regulation circuit 120 as shown in FIG. 4, the present disclosure provides two exemplary scenarios. In a first scenario, the impedance of the variable load circuit 110 reduces, thereby causing the load current 113 to increase. The increased load current 113 in turn causes the low reference voltage ($V_{REFL}$) to increase at the second output node 123, while the reduced load impedance causes the high reference voltage ($V_{REFH}$) to drop at the first output node 121. The VREF comparison circuit 411 senses the high reference voltage ($V_{REFH}$) drop by comparing the voltage fed back from the first output node 121 to the input reference voltage ($V_{REF}$).

In response, the VREF comparison circuit 411 adjust the current sense signal to increase the supply current 174 conducted by the reference resistor 416 by raising the current sense voltage $V_{CS}$ at its output lead 414. As a result, more supply current 174 is delivered before the current compensation signal 441 becomes responsive to the change of load current 113. The increased supply current 174 allows more output current 122 to be distributed to the variable load circuit 110 while the compensation current 133 remains unchanged at that point of time. This increased load current 113 increases the high reference voltage ($V_{REFH}$) to approach the reference input voltage (VREF), thereby stabilizing the voltage level at the first output node 121. The VSET comparison circuit 431 senses the current sense voltage ($V_{CS}$) increase by comparing it against the predetermined set voltage ($V_{SETP}$). In response, the VSET comparison circuit 431 adjust the current compensation signal 441 to reduce the amount of compensation current 133 conducted by the current compensation circuit 130.

In a configuration where the n-channel transistor 230 is deployed as a current switch, the VSET comparison circuit 431 reduces the voltage of the current compensation signal 132, which in turn causes the VGS voltage of the n-channel transistor 230 to shrink. Accordingly, the n-channel transistor 230 reduces the compensation current 133 to compensate the increase of load current 113. In an alternative configuration where a p-channel transistor is deployed as a current switch, the VSET comparison circuit 431 increases the voltage of the current compensation signal 132 to reduce the VGS voltage of the p-channel transistor. Likewise, the p-channel transistor reduces the compensation current 133 to compensate the increase of load current 113.

In a second scenario, the impedance of the variable load circuit 110 increases, thereby causing the load current 113 to decrease. The decreased load current 113 in turn causes the low reference voltage ($V_{REFL}$) to decrease at the second output node 123, while the increased load impedance causes the high reference voltage ($V_{REFH}$) to rise at the first output node 121. The VREF comparison circuit 411 senses the high reference voltage ($V_{REFH}$) rise by comparing the voltage fed back from the first output node 121 to the input reference voltage ($V_{REF}$).

In response, the VREF comparison circuit 411 adjust the current sense signal to reduce the supply current 174 conducted by the reference resistor 416 by dropping the current sense voltage $V_{CS}$ at its output lead 414. As a result, less supply current 174 is delivered before the current compensation signal 441 becomes responsive to the change of load current 113. The reduced supply current 174 allows less output current 122 to be distributed to the variable load circuit 110 while the compensation current 133 remains unchanged at that point of time. This increased load current 113 reduces the high reference voltage ($V_{REFH}$) to approach the reference input voltage (VREF), thereby stabilizing the voltage level at the first output node 121. The VSET comparison circuit 431 senses the current sense voltage ($V_{CS}$) reduction by comparing it against the predetermined set voltage ($V_{SETP}$). In response, the VSET comparison circuit 431 adjust the current compensation signal 441 to increase the amount of compensation current 133 conducted by the current compensation circuit 130.

In a configuration where the n-channel transistor 230 is deployed as a current switch, the VSET comparison circuit 431 increases the voltage of the current compensation signal 132, which in turn causes the $V_{GS}$ voltage of the n-channel transistor 230 to widen. Accordingly, the n-channel transistor 230 increases the compensation current 133 to compensate the reduction of load current 113. In an alternative configuration where a p-channel transistor is deployed as a current switch, the VSET comparison circuit 431 reduces the voltage of the current compensation signal 132 to increase the $V_{GS}$ voltage of the p-channel transistor. Likewise, the p-channel transistor increases the compensation current 133 to compensate the reduction of load current 113.

Like the operation as described in FIG. 2, the net effect of the compensation current 133 adjustment is to restore the ground current 114 to its stable level such that the low reference voltage ($V_{REFL}$) can remain low and stable. This feedback compensation scheme allows the total ground current 114 to return to a stabilized level in a relatively short period of time. Advantageously, the voltage regulation circuit 120 as described in FIG. 4 provides a robust voltage regulation performance without introducing the typical costs of an additional ground buffer. Moreover, for not including the monitoring current path 160 and the supply current path 170, the voltage regulation circuit 120 of FIG. 4 consumes less power than the voltage regulation circuit 120 of FIGS. 2 and 3.

Figure 5:
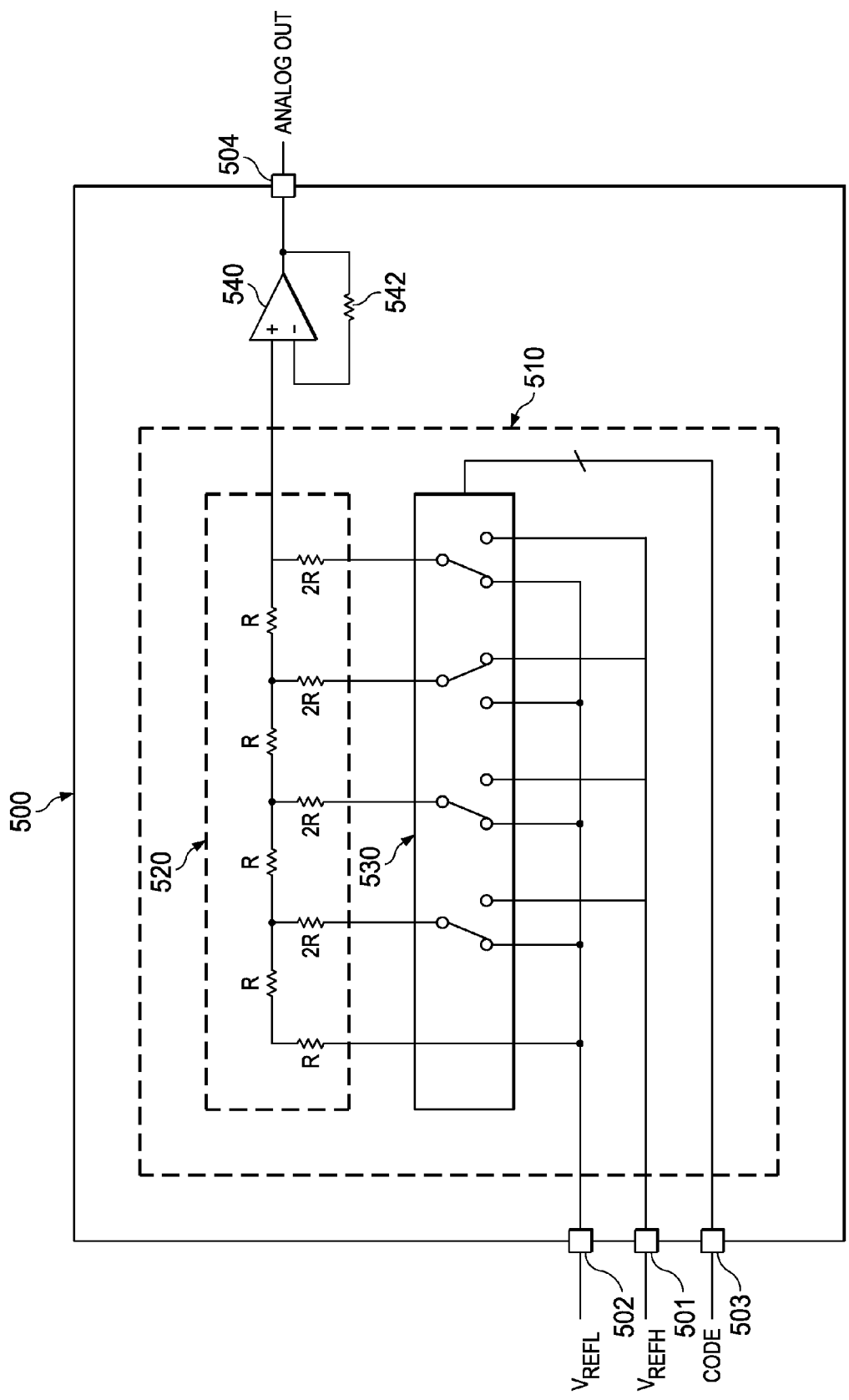
FIG. 5 shows a schematic view of an exemplary digital-to-analog conversion (DAC) circuit according to an aspect of the present disclosure.

FIG. 5 shows a schematic view of an exemplary digital-to-analog conversion (DAC) circuit 500 according to an aspect of the present disclosure. The DAC circuit 500 can be included as a part of the variable load circuit 110 as shown in FIG. 1 and as discussed along with FIGS. 2-4. When any one of the voltage regulation circuits 120 (see, e.g., FIGS. 1-4) is used in conjunction with the DAC circuit 500, the combined circuitry forms a digital-to-analog conversion system, which can be implemented in a single integrated circuit or as discrete components disposed on a printed circuit board. At its periphery, the DAC circuit 500 includes a high reference input port 501, a low reference input port 502, a digital code input port 503, and an analog output port 504.

The high reference input port 501 is coupled to the high reference node 111 to receive the high reference voltage ($V_{REFH}$), whereas the low reference input port 502 is coupled to the low reference node 112 to receive the low reference voltage ($V_{REFL}$). The digital code input port 503 is configured to receive a digital code from which the DAC circuit 500 converts to an analog output for delivery at its analog output port 504. This conversion is performed by the internal circuitries of the DAC circuit 500, including a variable resistance network 510, an amplifier 540, and a feedback resistor 542. The variable resistance network 510 may exhibit variable resistance based on the digital code received at the digital code input port 503.

The variable resistance network 510 includes a resistor ladder (e.g., an R2R ladder) 520 and a DAC switch circuit 530. The DAC switch circuit 530 is controlled by the digital code such that it may selectively connect one or more branches (e.g., the 2R branch) of the resistor ladder 520 to either the high reference input port 501 or the low reference input port 502. This selective connection may result in a change of impedance across the high reference input port 501 and the low reference input port 502. To that end, the load current 113 delivered across these two ports (i.e., 501 and 502) is also dependent on the digital code received by the digital code input port 504.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the methods and/or operations described (such as a program encoded in a computer-readable medium, which can be a memory device, a storage device, a machine-readable storage substrate, or other physical, machine-readable medium, or a combination of one or more of them).

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A reference voltage regulation (RVR) circuit for supplying a reference voltage across a variable load, the RVR circuit comprising:
   a first output node configured to deliver an output current to the variable load;
   a second output node configured to collect the output current from the variable load;
   a current compensation circuit coupled between the first and second output nodes, the current compensation circuit having a control terminal configured to receive a current compensation signal for adjusting a compensation current across the first and second output nodes via the current compensation circuit; and
   a current sensor coupled with the first and second output nodes to sense a change of the output current, the current sensor configured to generate the current compensation signal based on the sensed change of the output current.

2. The RVR circuit of claim 1, wherein the current sensor includes:
a supply current path having a supply output node coupled with the first output node to deliver a supply current sustaining the output current and the compensation current; and
a monitoring current path configured to deliver a monitoring current responsive to the sensed change of the output current, the monitoring current path having a monitoring output node to deliver the current compensation signal based on the monitoring current.

3. The RVR circuit of claim 2, wherein:
the supply current path includes a first p-channel transistor configured to conduct the supply current based on a gate-source bias voltage responsive to the sensed change of the output current; and
the monitoring current path includes a second p-channel transistor configured to conduct the monitoring current proportional to the supply current and based on the gate-source bias voltage responsive to the sensed change of the output current.

4. The RVR circuit of claim 3, wherein the monitoring current path includes:
a resistor coupled with the second p-channel transistor to establish a monitoring set voltage based on the monitoring current; and
a comparison circuit configured to generate the current compensation signal based on a comparison between the monitoring set voltage and a predetermined set voltage, the comparison circuit having:
a first input coupled with the resistor to receive the monitoring set voltage;
a second input configured to receive the predetermined set voltage; and
a comparison output coupled with the monitoring output node to deliver the current compensation signal.

5. The RVR circuit of claim 4, wherein the predetermined set voltage is predetermined based on a function of the resistor and an estimated maximum value of the output current.

6. The RVR circuit of claim 4, wherein the current compensation circuit includes an n-channel transistor having:
a drain node coupled with the first output node;
a gate node coupled with the monitoring output node via the control terminal to receive the current compensation signal; and
a source node coupled with the second output node.

7. The RVR circuit of claim 3, wherein the monitoring current path includes:
a current source coupled with the second p-channel transistor via the monitoring output node, the current source configured to conduct a set current adjusting the current compensation signal at the monitoring output node.

8. The RVR circuit of claim 7, wherein the set current is predetermined based on a function of an estimated maximum value of the output current.

9. The RVR circuit of claim 7, wherein the current compensation circuit includes a p-channel transistor having:
a source node coupled with the first output node;
a gate node coupled with the monitoring output node via the control terminal to receive the current compensation signal; and
a drain node coupled with the second output node.

10. The RVR circuit of claim 1, wherein the current sensor includes an amplifier coupled with the first output node, the amplifier configured to generate a feedback control signal proportional to the change of the output current.

11. The RVR circuit of claim 1, wherein the current sensor includes:
a first sensing stage coupled with the first output node to sense the change of the output current, the first sensing stage configured to generate a current sense signal responding positively to the sensed change of the output current; and
a second sensing stage coupled with the first sensing stage to receive the current sense signal, the second sensing stage configured to generate the current compensation signal based on a comparison between the current sense signal and a predetermined set voltage.

12. The RVR circuit of claim 11, wherein the first sensing stage includes:
a comparison circuit having a negative input lead coupled with the first output node, a positive input lead configured to receive a reference input signal, and an output lead configured to deliver the current sense signal; and
a resistor coupled in series between the output lead and the first output node.

13. The RVR circuit of claim 11, wherein the second sensing stage includes:
a comparison circuit having a negative input lead coupled with the first sensing stage to receive the current sense signal, a positive input lead configured to receive a predetermined set voltage, and an output lead configured to deliver the current compensation signal.

14. The RVR circuit of claim 1, wherein the current sensor includes:
a first comparison circuit having a first negative input lead coupled with the first output node, a first positive input lead configured to receive a reference input signal, and a first output lead;
a second comparison circuit having a second negative input lead coupled with the first output lead of the first comparison circuit, a second positive input lead configured to receive a predetermined set voltage, and a second output lead coupled with the control terminal of the current compensation circuit; and
a resistor coupled in series between the first output lead and the first output node.

15. The RVR circuit of claim 1, wherein the current sensor is configured to adjust the current compensation signal to increase the compensation current upon sensing a reduction of the output current.

16. The RVR circuit of claim 1, wherein the current sensor is configured to adjust the current compensation signal to reduce the compensation current upon sensing an increment of the output current.

17. The RVR circuit of claim 1, wherein the current sensor is configured to adjust the current compensation signal to stabilize a supply current including the output current and the compensation current.

18. A reference voltage regulation (RVR) circuit for supplying a reference voltage across a variable load, the RVR circuit comprising:
a first output node configured to deliver an output current to the variable load;
a second output node configured to collect the output current from the variable load;
a current compensation circuit coupled between the first and second output nodes, the current compensation circuit having a control terminal configured to receive a current compensation signal for adjusting a compensation current across the first and second output nodes via the current compensation circuit; and a current sensor including:
  a supply current path having a supply output node coupled with the first output node to deliver a supply current sustaining the output current and the compensation current; and
  a monitoring current path configured to deliver a monitoring current responsive to a sensed change of the output current, the monitoring current path having a monitoring output node to deliver the current compensation signal based on the monitoring current.

19. The RVR circuit of claim 18, wherein:
the supply current path includes a first p-channel transistor configured to conduct the supply current based on a gate-source bias voltage responsive to the sensed change of the output current; and
the monitoring current path includes a second p-channel transistor configured to conduct the monitoring current proportional to the supply current and based on the gate-source bias voltage responsive to the sensed change of the output current.

20. The RVR circuit of claim 19, wherein the monitoring current path includes:
  a resistor coupled with the second p-channel transistor to establish a monitoring set voltage based on the monitoring current; and
  a comparison circuit configured to generate the current compensation signal based on a comparison between the monitoring set voltage and a predetermined set voltage, the comparison circuit having:
    a first input coupled with the resistor to receive the monitoring set voltage;
    a second input configured to receive the predetermined set voltage; and
    a comparison output coupled with the monitoring output node to deliver the current compensation signal.

21. The RVR circuit of claim 20, wherein the predetermined set voltage is predetermined based on a function of the resistor and an estimated maximum value of the output current.

22. The RVR circuit of claim 20, wherein the current compensation circuit includes an n-channel transistor having:
  a drain node coupled with the first output node;
  a gate node coupled with the monitoring output node via the control terminal to receive the current compensation signal; and
  a source node coupled with the second output node.

23. The RVR circuit of claim 19, wherein the monitoring current path includes:
  a current source coupled with the second p-channel transistor via the monitoring output node, the current source configured to conduct a set current adjusting the current compensation signal at the monitoring output node.

24. The RVR circuit of claim 23, wherein the set current is predetermined based on a function of an estimated maximum value of the output current.

25. The RVR circuit of claim 23, wherein the current compensation circuit includes a p-channel transistor having:
  a source node coupled with the first output node;
  a gate node coupled with the monitoring output node via the control terminal to receive the current compensation signal; and
  a drain node coupled with the second output node.

26. A reference voltage regulation (RVR) circuit for supplying a reference voltage across a variable load, the RVR circuit comprising:
  a first output node configured to deliver an output current to the variable load;
  a second output node configured to collect the output current from the variable load;
  a current compensation circuit coupled between the first and second output nodes, the current compensation circuit having a control terminal configured to receive a current compensation signal for adjusting a compensation current across the first and second output nodes via the current compensation circuit; and
  a current sensor including:
    a first sensing stage coupled with the first output node to sense the change of the output current, the first sensing stage configured to generate a current sense signal responding positively to a sensed change of the output current; and
    a second sensing stage coupled with the first sensing stage to receive the current sense signal, the second sensing stage configured to generate the current compensation signal based on a comparison between the current sense signal and a predetermined set voltage.

27. The RVR circuit of claim 26, wherein the first sensing stage includes:
  a comparison circuit having a negative input lead coupled with the first output node, a positive input lead configured to receive a reference input signal, and an output lead configured to deliver the current sense signal; and
  a resistor coupled in series between the output lead and the first output node.

28. The RVR circuit of claim 26, wherein the second sensing stage includes:
  a comparison circuit having a negative input lead coupled with the first sensing stage to receive the current sense signal, a positive input lead configured to receive a predetermined set voltage, and an output lead configured to deliver the current compensation signal.

29. The RVR circuit of claim 26, wherein the current sensor is configured to adjust the current compensation signal to increase the compensation current upon sensing a reduction of the output current.

30. The RVR circuit of claim 26, wherein the current sensor is configured to adjust the current compensation signal to reduce the compensation current upon sensing an increment of the output current.

31. The RVR circuit of claim 26, wherein the current sensor is configured to adjust the current compensation signal to stabilize a supply current including the output current and the compensation current.

32. A digital-to-analog conversion (DAC) system comprising:
  a variable resistance network having a high reference node and a low reference node, the variable resistance network configured to conduct a load current from the high reference node to the low reference node, the load current adjustable based on a digital code;
  a current compensation circuit coupled between the high and low reference nodes, the current compensation circuit having a control terminal configured to receive a current compensation signal for adjusting a compensation current bypassing the variable resistance network; and
  a current sensor coupled with the high and low reference nodes to sense a change of the load current, the current sensor configured to generate the current compensation signal based on the sensed change of the load current.

33. The DAC system of claim 32, wherein the current sensor includes:
a supply current path having a supply output node coupled with the high reference node to deliver a supply current sustaining the low current and the compensation current; and
a monitoring current path configured to deliver a monitoring current responsive to the sensed change of the low current, the monitoring current path having a monitoring output node to deliver the current compensation signal based on the monitoring current.

34. The DAC system of claim 33, wherein:
the supply current path includes a first p-channel transistor configured to conduct the supply current based on a gate-source bias voltage responsive to the sensed change of the low current; and
the monitoring current path includes a second p-channel transistor configured to conduct the monitoring current proportional to the supply current and based on the gate-source bias voltage responsive to the sensed change of the low current.

35. The DAC system of claim 34, wherein the monitoring current path includes:
a resistor coupled with the second p-channel transistor to establish a monitoring set voltage based on the monitoring current; and
a comparison circuit configured to generate the current compensation signal based on a comparison between the monitoring set voltage and a predetermined set voltage, the comparison circuit having:
a first input coupled with the resistor to receive the monitoring set voltage;
a second input configured to receive the predetermined set voltage; and
a comparison output coupled with the monitoring output node to deliver the current compensation signal.

36. The DAC system of claim 35, wherein the predetermined set voltage is predetermined based on a function of the resistor and an estimated maximum value of the low current.

37. The DAC system of claim 35, wherein the current compensation circuit includes an n-channel transistor having:
a drain node coupled with the high reference node;
a gate node coupled with the monitoring output node via the control terminal to receive the current compensation signal; and
a source node coupled with the low reference node.

38. The DAC system of claim 34, wherein the monitoring current path includes:
a current source coupled with the second p-channel transistor via the monitoring output node, the current source configured to conduct a set current adjusting the current compensation signal at the monitoring output node.

39. The DAC system of claim 38, wherein the set current is predetermined based on a function of an estimated maximum value of the low current.

40. The DAC system of claim 38, wherein the current compensation circuit includes a p-channel transistor having:
a source node coupled with the high reference node;
a gate node coupled with the monitoring output node via the control terminal to receive the current compensation signal; and
a drain node coupled with the low reference node.

41. The DAC system of claim 32, wherein the current sensor includes an amplifier coupled with the high reference node, the amplifier configured to generate a feedback control signal proportional to the change of the low current.

42. The DAC system of claim 32, wherein the current sensor includes:
a first sensing stage coupled with the high reference node to sense the change of the low current, the first sensing stage configured to generate a current sense signal responding positively to the sensed change of the low current; and
a second sensing stage coupled with the first sensing stage to receive the current sense signal, the second sensing stage configured to generate the current compensation signal based on a comparison between the current sense signal and a predetermined set voltage.

43. The DAC system of claim 42, wherein the first sensing stage includes:
a comparison circuit having a negative input lead coupled with the first output node, a positive input lead configured to receive a reference input signal, and an output lead configured to deliver the current sense signal; and
a resistor coupled in series between the output lead and the high reference node.

44. The DAC system of claim 42, wherein the second sensing stage includes:
a comparison circuit having a negative input lead coupled with the first sensing stage to receive the current sense signal, a positive input lead configured to receive a predetermined set voltage, and an output lead configured to deliver the current compensation signal.

45. The DAC system of claim 32, wherein the current sensor includes:
a first comparison circuit having a first negative input lead coupled with the high reference node, a first positive input lead configured to receive a reference input signal, and a first output lead;
a second comparison circuit having a second negative input lead coupled with the first output lead of the first comparison circuit, a second positive input lead configured to receive a predetermined set voltage, and a second output lead coupled with the control terminal of the current compensation circuit; and
a resistor coupled in series between the first output lead and the high reference node.

46. The DAC system of claim 32, wherein the current sensor is configured to adjust the current compensation signal to increase the compensation current upon sensing a reduction of the low current.

47. The DAC system of claim 32, wherein the current sensor is configured to adjust the current compensation signal to reduce the compensation current upon sensing an increment of the low current.

48. The DAC system of claim 32, wherein the current sensor is configured to adjust the current compensation signal to stabilize a supply current including the low current and the compensation current.

* * * * *